(12) United States Patent
Lancia et al.

(10) Patent No.: US 11,409,603 B2
(45) Date of Patent: Aug. 9, 2022

(54) METHOD OF STORING ITEMS OF DATA

(71) Applicant: AVA VIDEO SECURITY LIMITED, Middlesex (GB)

(72) Inventors: Samuel Lancia, Uxbridge (GB); Kjetil Rensel, Fornebu (NO)

(73) Assignee: AVA VIDEO SECURITY LIMITED, Uxbridge (GB)

( * ) Notice: Subject to any disclaimer, the term of this patent is extended or adjusted under 35 U.S.C. 154(b) by 0 days.

(21) Appl. No.: 16/845,218

(22) Filed: Apr. 10, 2020

(65) Prior Publication Data
US 2020/0327012 A1 Oct. 15, 2020

(30) Foreign Application Priority Data

Apr. 12, 2019 (GB) ..................................... 1905209

(51) Int. Cl.
*G06F 11/10* (2006.01)
*H03M 13/15* (2006.01)
(52) U.S. Cl.
CPC ....... *G06F 11/1092* (2013.01); *H03M 13/154* (2013.01)
(58) Field of Classification Search
CPC ............ G06F 11/1092; G06F 11/1076; H03M 13/154; H03M 13/373; H03M 13/1515
See application file for complete search history.

(56) References Cited

U.S. PATENT DOCUMENTS

| 9,280,416 | B1* | 3/2016 | Xin | H03M 13/3761 |
| 2016/0139984 | A1* | 5/2016 | Lee | H03M 13/05 714/758 |
| 2017/0033806 | A1* | 2/2017 | Arslan | G06F 3/0689 |
| 2018/0018231 | A1* | 1/2018 | Okada | G06F 3/064 |
| 2019/0050289 | A1* | 2/2019 | Kachare | H03M 13/154 |
| 2020/0097199 | A1* | 3/2020 | Ye | G06F 3/0631 |

OTHER PUBLICATIONS

Application No. EP 20 16 9128, extended European Search Report dated Dec. 21, 2020, 12 pages.

* cited by examiner

*Primary Examiner* — Thien Nguyen

(57) ABSTRACT

A computer-implemented method of storing an item of data across a plurality of storage media, the method comprising the steps of: receiving an item of data to be stored; splitting the item of data into N pieces of data; generating M redundancy pieces of data, usable to rebuild the item of data; storing each of the N pieces of data and M redundancy pieces of data on separate storage media of the plurality of storage media at a same offset within a file of the respective storage medium, the files of the storage media containing the N pieces of data and the M redundancy pieces of data being associated as a file set; and storing, separately to the N pieces of data and M redundancy pieces of data, the offset and the file set.

18 Claims, 11 Drawing Sheets

METHOD OF STORING ITEMS OF DATA

CROSS-REFERENCE TO RELATED APPLICATION

This application claims priority to Great Britain Application No. 1905209.1, filed Apr. 12, 2019, which is hereby incorporated by reference in its entirety for all purposes.

FIELD OF THE INVENTION

The present invention relates to a compute-implemented method of storing an item of data across a plurality of storage media, a computer-implemented method of rebuilding lost data, a computer-implemented method of reading an item of data, and a system.

BACKGROUND

When performing video surveillance, the captured video, audio, analytics results, and metadata must be stored so as to be viewable in the future. To ensure that this is possible, it is necessary to handle cases where some of the original data is either corrupted or lost.

This loss or corruption can happen due to the partial or complete failure of one or more storage media, e.g. hard disk drives, storing the data. This also applies to any metadata about the stored images/audio file such as analytics data, source information, etc.

Traditionally, this problem has been solved by either storing multiple copies of the data (known as RAID1), by using redundant disk systems (RAID-5, 6) or by means of backup to an alternative location.

However each of these technologies has disadvantages. Creating full duplicates of the data requires doubling the disk capacity required. Likewise, any backup scheme needs significant additional capacity for holding the backup data.

RAID 5 and 6 offer lower overhead for redundancy, as these respectively allow for 1 or 2 parity blocks to be created for all data, and the storage of the original data and the parity data across a group of disks. However, higher redundancy options are not available. These options can therefore create bottlenecks when rebuilding data after a drive failure. They also have a fixed size for the disk set, and when a disk is not available these schemes write with reduced redundancy.

Erasure coding is another known technique which allows for arbitrary combinations of data and redundant blocks. It is typically specified as (N+M), with N being the number of data blocks and M being the number of redundant blocks (i.e. blocks used to recover the N data blocks).

The invention was devised given the above considerations, and also given the desire to increase the flexibility in storing data with redundancy.

SUMMARY

Accordingly, in a first aspect, the invention provides a computer-implemented method of storing an item of data across a plurality of storage media, the method comprising the steps of:
  receiving an item of data to be stored;
  splitting the item of data into N pieces of data;
  generating M redundancy pieces of data, usable to rebuild the item of data;
  storing each of the N pieces of data and M redundancy pieces of data on separate storage media of the plurality of storage media at a same offset within a file of the respective storage medium, the files of the storage media containing the N pieces of data and the M redundancy pieces of data being associated as a file set; and
  storing, separately to the N pieces of data and M redundancy pieces of data, the offset and the file set.

Advantageously, such a method results in the more efficient use of disk space than backup methods known in the prior art. Further, the efficiency for reading and writing data is improved. Moreover, the method increases flexibility by allowing the number of disks to be varied without affecting the resiliency level or requiring subsequent rebuilds. Further, the method allows the level of redundancy to be varied in accordance with the importance of the data to be stored.

Optional features of the invention will now be set out. These are applicable singly or in any combination with any aspect of the invention.

M and N are preferably integers greater than or equal to one. In examples where M is one, there may be a parity piece of data used.

The method may further include a step, after receiving the item of data to be stored, of determining a value of M and N based on one or more properties of the item of data and/or one or more properties of the plurality of storage media. For example, the value of M and/or N may depend on a value X indicative of the number of the storage media available for storing data.

The value of M may be based on a redundancy level. The redundancy level may be determined based on a retention schedule associated with the item of data. The item of data may be data captured from a video camera, and the redundancy level may be determined based on whether the data captured form the video camera includes any predetermined features of interest. For example, a machine learning algorithm or similar may determine that the data includes the image of a person and accordingly the redundancy level may be set higher than if the data did not include this image. The item of data may be data captured from a video camera, and the redundancy level may be determined based on a derived importance level of the data captured from the video camera. For example, if the item of data corresponds to video captured during the closed hours of a business, the redundancy level may be set to be higher than if the item of data corresponded to video captured during the opening hours of the business.

Generating the M redundancy pieces of data may be performed by passing the N pieces of data to an erasure coding algorithm. For example, the erasure coding algorithm may be a Reed Solomon erasure coding algorithm, a ReGenerating (LG), or Locally Recoverable (LR) erasure code. Preferably the erasure coding algorithm is the Reed Solomon erasure coding algorithm.

The method may include a step of removing an expired item of data by hole punching the items of data corresponding to the expired item of data. The step of removing the expired item of data may include a step of compressing the hole left by the hole punching in each file of the respective file set.

In a second aspect, the invention provides a method of rebuilding lost pieces of an item of data, comprising the steps of:
  reading all existing and non-corrupted pieces of data associated with the item of data;
  determining, from the metadata associated with the existing piece of data, a number of lost or corrupted data pieces;
  rebuilding the lost or corrupted pieces of data; and storing the rebuilt pieces of data according to the method of the first aspect.

The rebuilding of lost or corrupted pieces of data may be ordered based on one or more:

an importance of the item of data including the lost or corrupted pieces of data, as indicated by metadata associated with the item of data;

the current level of redundancy taking into account the lost or corrupted pieces of data; and the time at which the item of data is required, as determined by a retention policy associated with the item of data.

In a third aspect, the invention provides a method of reading an item of data stored according to the method of the first aspect, the method of reading the item of data comprising the steps of:

determining an offset at which pieces of data associated with the item of data are stored on each of a plurality of storage media;

reading each of the pieces of data, and thereby generating a read item of data;

determining, from metadata associated with each read piece of data, whether the read item of data is valid; and returning the read item of data to a requester of the item of data when it is determined that the read item of data is valid.

The method may further comprise a step of rebuilding any lost or corrupted pieces of the item of data when it is determined that the read item of data is invalid or incomplete. The rebuilding of lost or corrupted pieces of data may be ordered based on one or more of: an importance of the item of data including the lost or corrupted pieces of data, as indicated by metadata associated with the item of data; the current level of redundancy taking into account the lost or corrupted pieces of data; and the time at which the item of data is required, as determined by a retention policy associated with the item of data. Rebuilding the lost pieces of data may include determining whether only redundant pieces of data are missing, and the method may include rebuilding the lost redundancy pieces in parallel to returning the read item of data.

In a fourth aspect, the invention provides a system including a network adapter, a processor, and a plurality of storage media, wherein the processor is configured to:

receive, via the network adapter, an item of data to be stored;

split the data into N pieces of data;

generate M redundancy pieces of data, usable to rebuild the item of data;

store each of the N pieces of data and M redundancy pieces of data on separate storage media of the plurality of storage media at a same offset within a file of the respective storage medium, the files of the storage media containing the N pieces of data and the M pieces of redundancy data being associated as a file set; and store, separately to the N pieces of data and the M redundancy pieces of data, the offset and the file set.

The processor may be configured to perform the method of any of the first to third aspects, including any of the optional features set out with respect thereto.

Further aspects of the present invention provide: a computer program comprising code which, when run on a computer, causes the computer to perform the method of the first, second, or third aspect; a computer readable medium storing a computer program comprising code which, when run on a computer, causes the computer to perform the method of the first, second, or third aspect; and a computer system programmed to perform the method of the first, second, or third aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
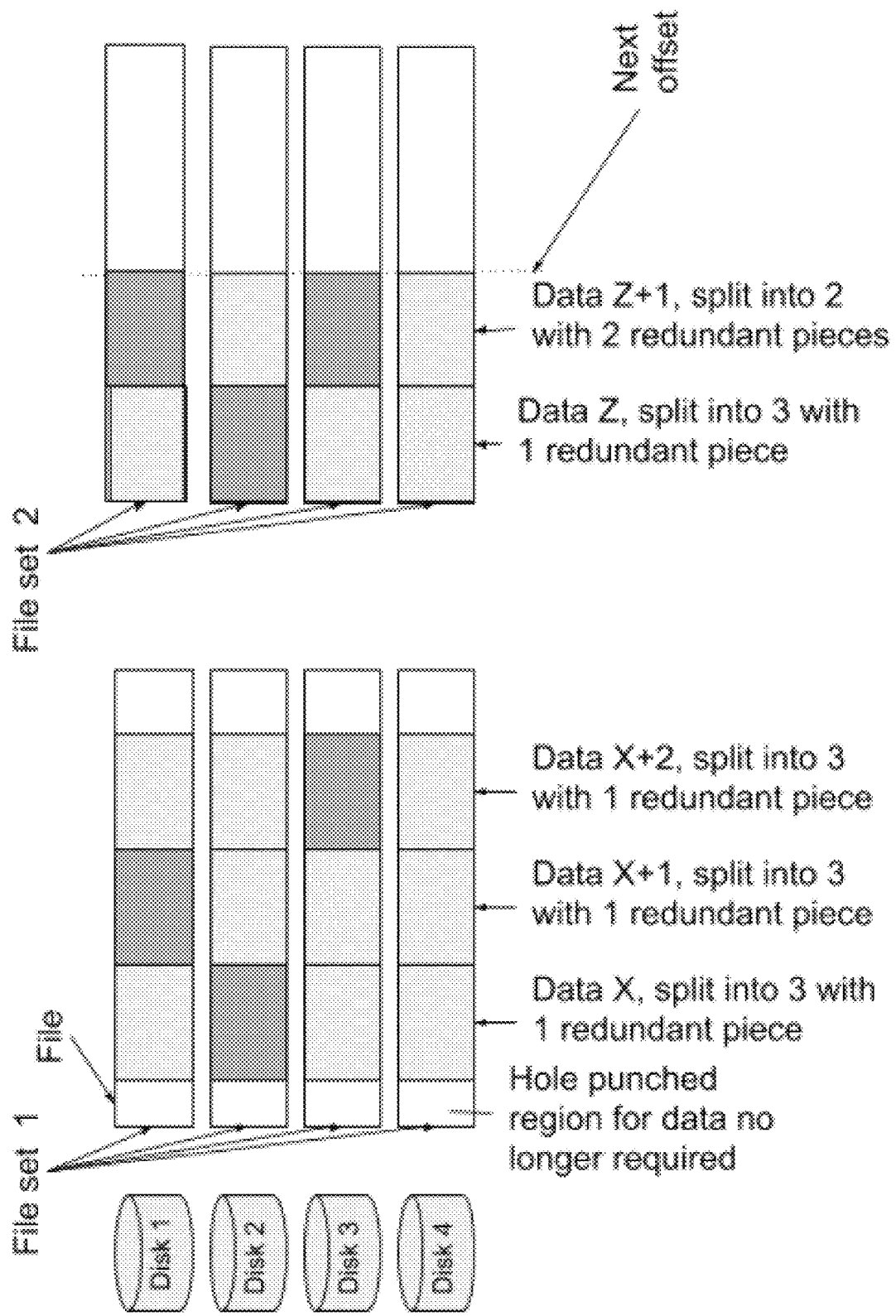
FIG. 1 shows an example of data stored according to the present invention.

Aspects and embodiments of the present invention will now be discussed with reference to the accompanying figures. Further aspects and embodiments will be apparent to those skilled in the art. All documents mentioned in this text are incorporated herein by reference FIG. 1 shows an example of an item of data stored according to the method of the first aspect.

Taking the first item of data, X, it is split into 3 pieces of data (lighter squares), and 1 redundant piece of data (darker square) is generated to aid in rebuilding the item of data X. Each piece of data, including the redundant piece of data, is stored in a separate disk of Disks 1-4 within a respective file. The pieces of data are stored at a same offset in the files corresponding to a file set. The offset is in kept in sync between files of the file set, so that the offset for all pieces of the same item of data are identical. This is true even if one of the disks does not have a piece of data written to it (as will be discussed later), in which case a blank section of the file will be left.

The process is repeated for the items of data X+1, and X+2, which are all stored in the same file set (File set 1). A file set may have a finite size, or may be demarked by a characteristic of the data being stored therein (e.g. from a given camera). Preferably a file set contains data received from a single camera, this can aid playback by making subsequent reading of the data faster.

A second file set, File set 2, is also stored between Disks 1-4. This second file set contains item of data Z and item of data Z+1. Of note, is that item of data Z+1 was only split into two pieces of data to be stored, and so two redundant pieces of data can be generated to facilitate the synchronization of the offset whilst not wasting space.

Each file within a given file set is treated equally, in that the redundant information is spread across all file sets rather than specific disks, or specific files within the file set, being used for redundant information.

When an item of data is stored, a header is preferably included per piece. This contains information facilitating the correct reassembly of the pieces of data making up the item of data, including any rebuilding which may need to take place. In practice, this header or metadata may contain the number of the piece of data, the number of disks used when writing that piece of data, and the resiliency level (amongst other information).

After the item of data has been stored, the file set and offset within the file set the item of data is stored separately. When an item of data is read, the pieces of data are read from the correct file on all disks using the same offset. An example is shown in Table 1:

| Data item | File set | Offset (bytes) |
|-----------|----------|----------------|
| X         | 1        | 100000         |
| X + 1     | 1        | 100100         |
| X + 2     | 1        | 100300         |
| Z         | 2        | 0              |
| Z + 1     | 2        | 200            |
| Z + 2     | 2        | 500            |

If a disk is unavailable no piece of data is written to that disk but, as discussed previously, the offset for the new data is still updated for the corresponding file on that disk. A later rebuild operation may write data to this offset within the file, or it may remain unused.

Figure 2:
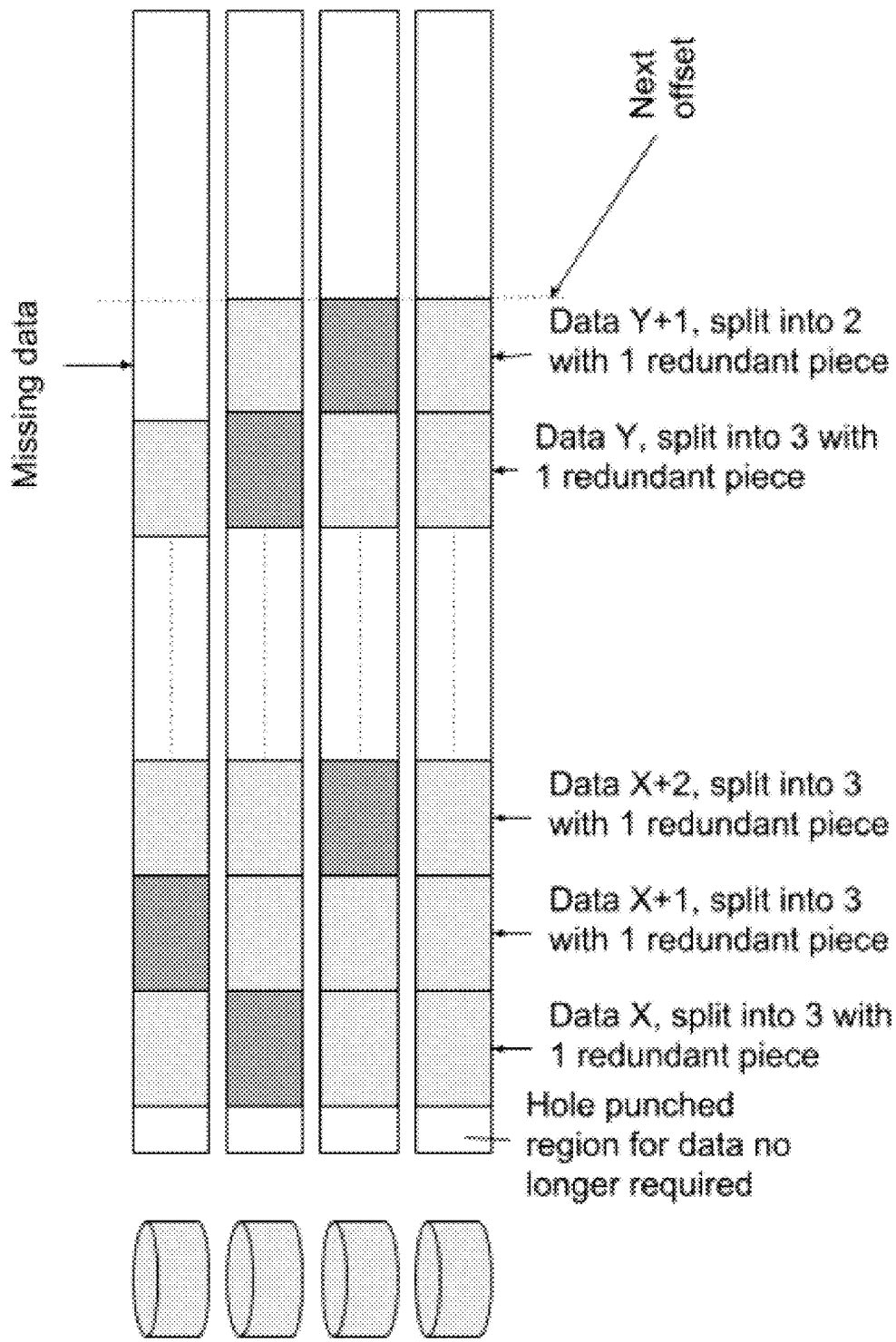
FIG. 2 shows a variant example of data stored according to the present invention.

FIG. 2 shows a variant example of data stored according to the method of the first aspect. Notably, in contrast to FIG. 1, there is missing data for disk 1. This can be either due to the disk being unavailable at the time of writing (due to being locked by another process, or otherwise unavailable) or due to the item of data not requiring all four disks for storage (and the level of redundancy not requiring enough redundancy pieces to fill the space).

Figure 3:
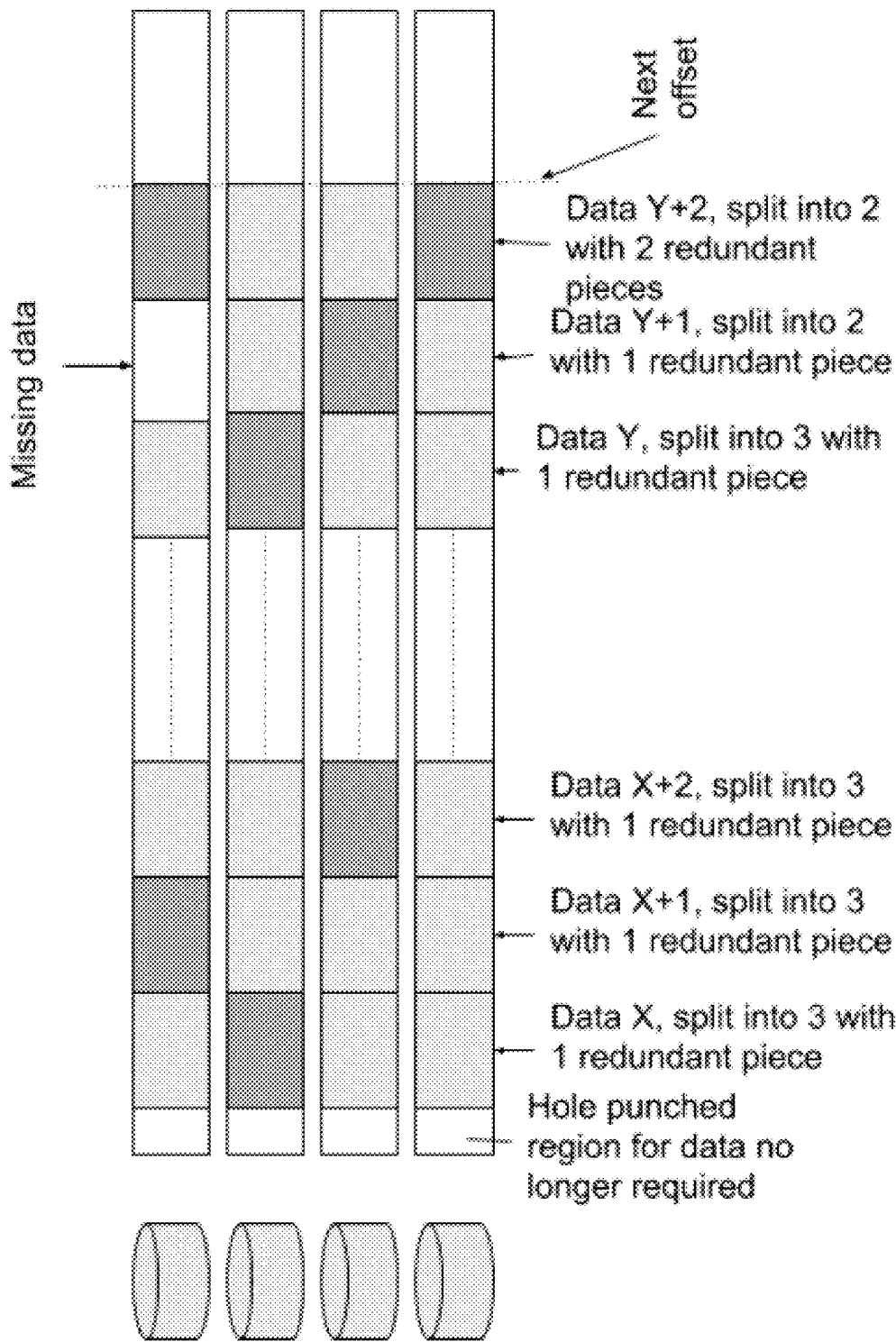
FIG. 3 shows the example of FIG. 2 after subsequent storage of data.

FIG. 3 shows the example in FIG. 2, after a further item of data has been stored. The most recently received item of data, Y+2, is written at the next available offset within a file set. Data is written to all of the available disks in the disk set (in this example, all four disks), and the offset is updated by the length of the data written. The table discussed above is then updated with the offset that was used in storing the item of data.

Figure 4:
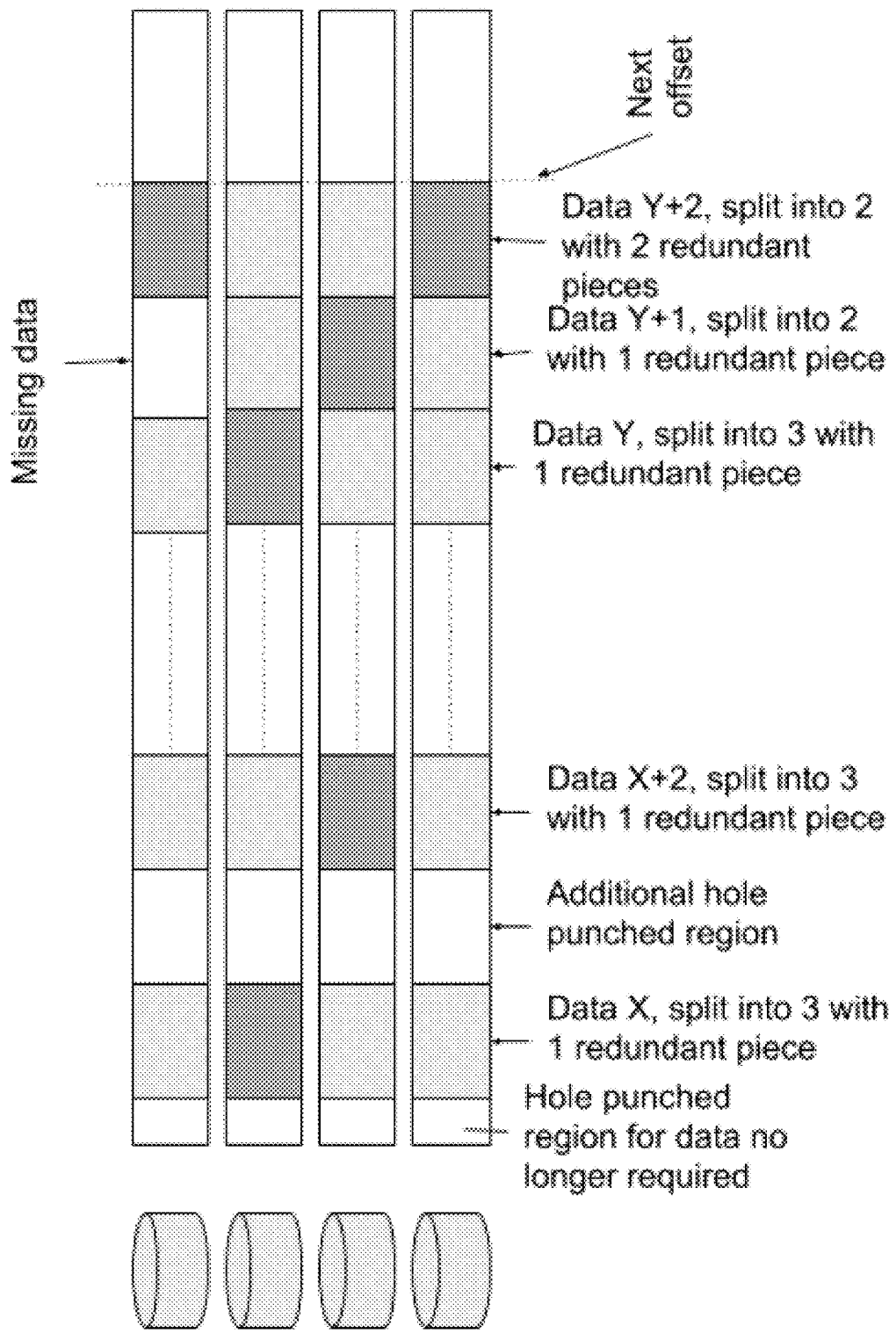
FIG. 4 shows the example of FIG. 3 after the removal of an expired piece of data.

FIG. 4 shows the example of FIG. 3 after the removal of an expired piece of data. When an item of data is no longer needed, e.g. due to a retention policy indicating that the item of data can safely deleted, the disk space is freed using a hole punching method. This does not affect the length of the data as seen by an application monitoring the disks, and all offsets are left unchanged. However, the holes left after hole punching may be compressed and this can free up additional space on each disk. The advantage of this approach is that the offset for all pieces remains the same even if some disks are temporarily unavailable. If a disk is unavailable at the time the hole punching operation is attempted, the hole punching occurs when it is next available.

Figure 5:
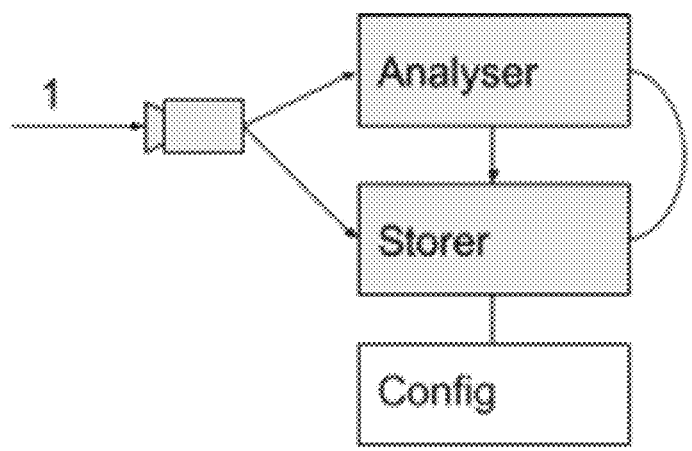
FIG. 5 shows a schematic of a system.
Figure 6A:
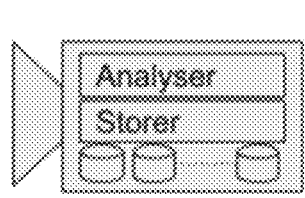
FIGS. 6a-6c show variant implementations of the system of FIG. 5.
Figure 6B:
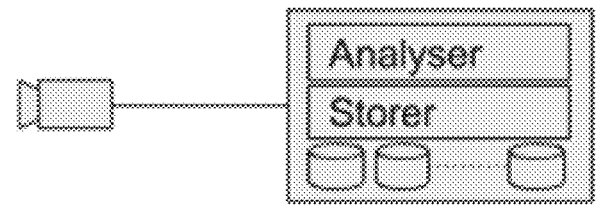
Figure 6C:
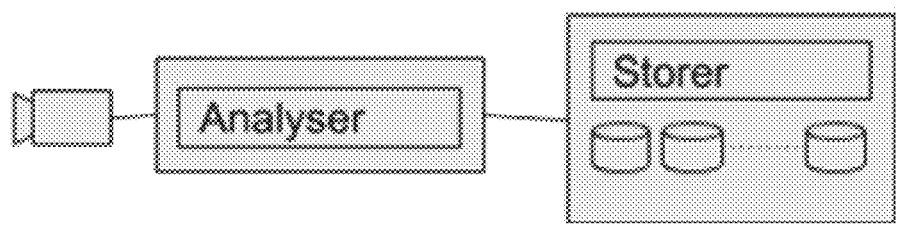

FIG. 5 shows a schematic of a system. Generally, the system includes a camera which captures a video and optionally an audio stream 1. The captured video and/or audio stream is provided either directly to a storer, or to the storer via an analyser. The storer includes a plurality of storage media for storing the captured video/audio stream. The analyser may determine features of interest in the video and/or audio stream, or determine an interest/importance level based on the content thereof. FIGS. 6a-6c show various implementations of the system in FIG. 5. In FIG. 6a, a single camera contains all of the components of the system, i.e. the camera also contains an analyser, a storer, a configuration file and a plurality of storage media. In contrast, in FIG. 6b, a camera is connected (e.g. via network interface) to a separate component which houses the analyser, storer, and configuration file, and plurality of storage media. Finally, in a further variant shown in FIG. 6c, a camera provides a stream of video and/or audio data to an analyser. The analyser performs the analysis discussed above, and provides the data and any analysis to the storer which is a separate component.

Of note, is that the storer and analyser are preferably executable programs operating on one or more processors, rather than discrete processing units in their own right. For example, the storer contains a number of worker threads. Each of these threads services one or more queues of requests. The requests have three types: read, write, and re-build, and any queue may contain any one or more of these types of request.

When handling a read request, the worker thread will check the availability of the storage media or disks. In this example, this is done using locks. Specifically, each worker locks a counting semaphore for each storage medium, with a timeout period. If a worker thread cannot access the semaphore within this timeout period, the worker thread assumes that the storage medium is unavailable.

Once the worker thread as identified whether each storage medium is available, it determines how many storage media of the total available storage media to use. It may be that the worker thread uses all available storage media, or only a subset. The number of storage media available is used to determine the redundancy level.

Figure 7:
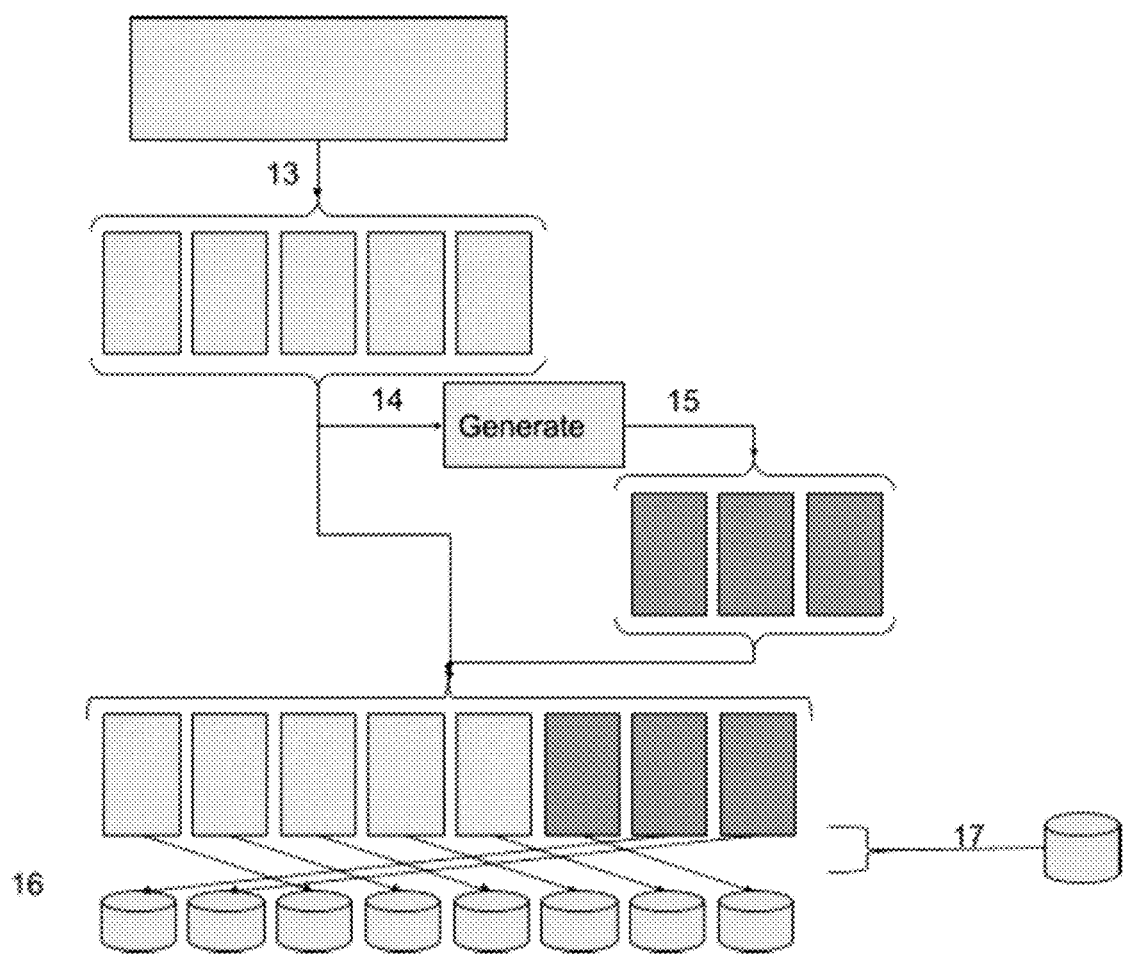
FIG. 7 illustrates a method according to the present invention.

Once the redundancy level has been set, the worked thread splits the item of data to be stored into N pieces, as shown in step 13 of FIG. 7. These pieces, along with a target number of redundancy pieces are passed in step 14 to a function to generate the redundancy pieces. In this example, a Reed Solomon erasure coding scheme is used to generate these redundancy pieces. The function, in step 15, generates the M additional redundancy pieces and in step 16, the worker thread stores each of these N pieces of data and M redundancy pieces to a separate storage medium of the available storage media. Each piece is written to the same offset in each file corresponding to the file set as discussed above. The mapping of piece number to storage medium is not fixed, and there is no dedicated parity storage medium. Further, the offset and file set where the data was written is stored separately.

If a storage medium fails, and data is lost, the system will determine the data affected and therefore which pieces of data need to be rebuilt. The system will prioritise the rebuild of the lost pieces based on any one or more of: an importance of the item of data including the missing pieces; the current level of redundancy taking into account the missing pieces of data; and the time at which the item of data may be required.

The rebuild request is then added to one of the queues discussed above. There may be more than one queue containing a rebuild request. This separation into different queues may be done in order to keep different priority requests in different queues, or requests with different priorities could exist in the same queue.

Figure 8:
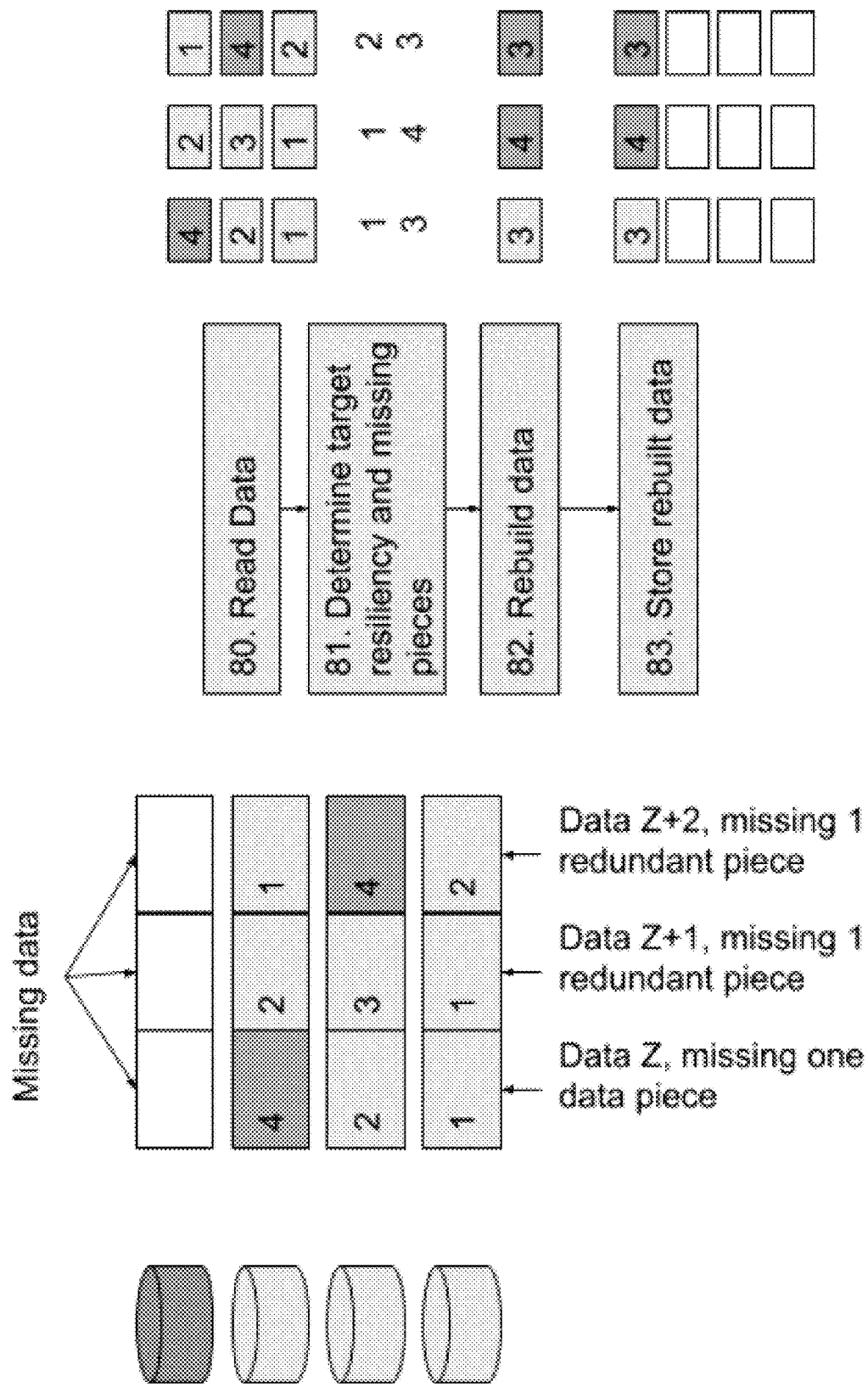
FIG. 8 illustrates a method of rebuilding lost pieces of data.

When a worker thread is handling a rebuild request it will first read all data pieces which exist (see step 80 in FIG. 8). From headers associated with the data pieces, the worker thread will determine the target resiliency and therefore the number of missing pieces of data in step 81. Subsequently, the worker thread will rebuild the data in a manner known per se in the art in step 82. Finally, the rebuilt data is stored in step 83.

Figure 9:
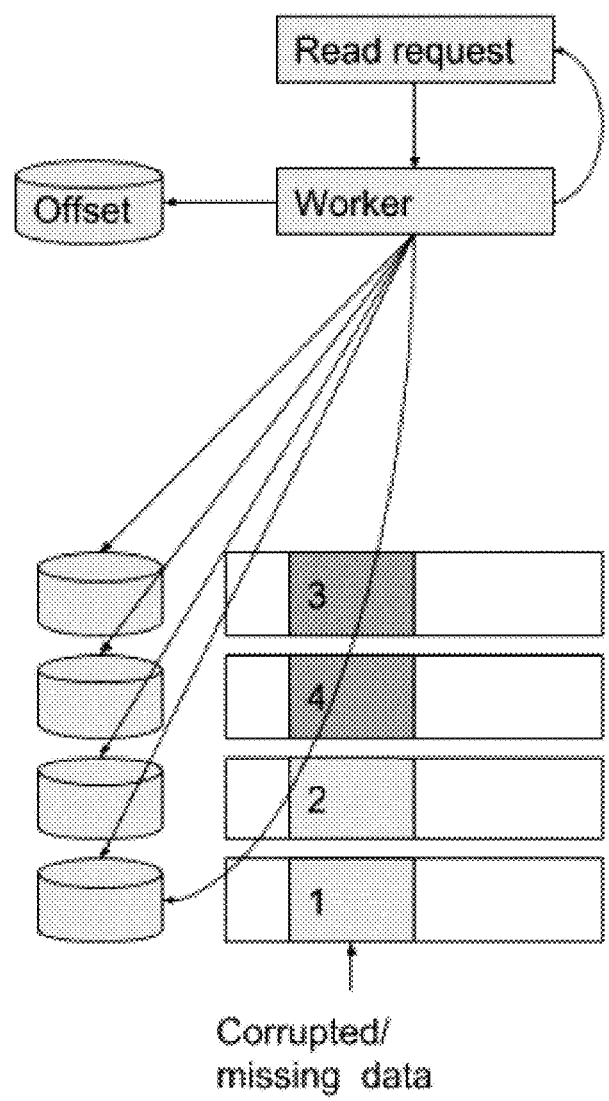
FIG. 9 illustrates a system for reading data stored according to the present invention.

The method described in relation to FIG. 8 is one performed in response to a determination that a storage medium has failed, or in some context asides from a standard read command for the data. However, as illustrated in FIG. 9, a worker thread may, in response to a standard read command, ascertain that a piece of data forming the requested item of data is corrupted or missing.

Figure 10:
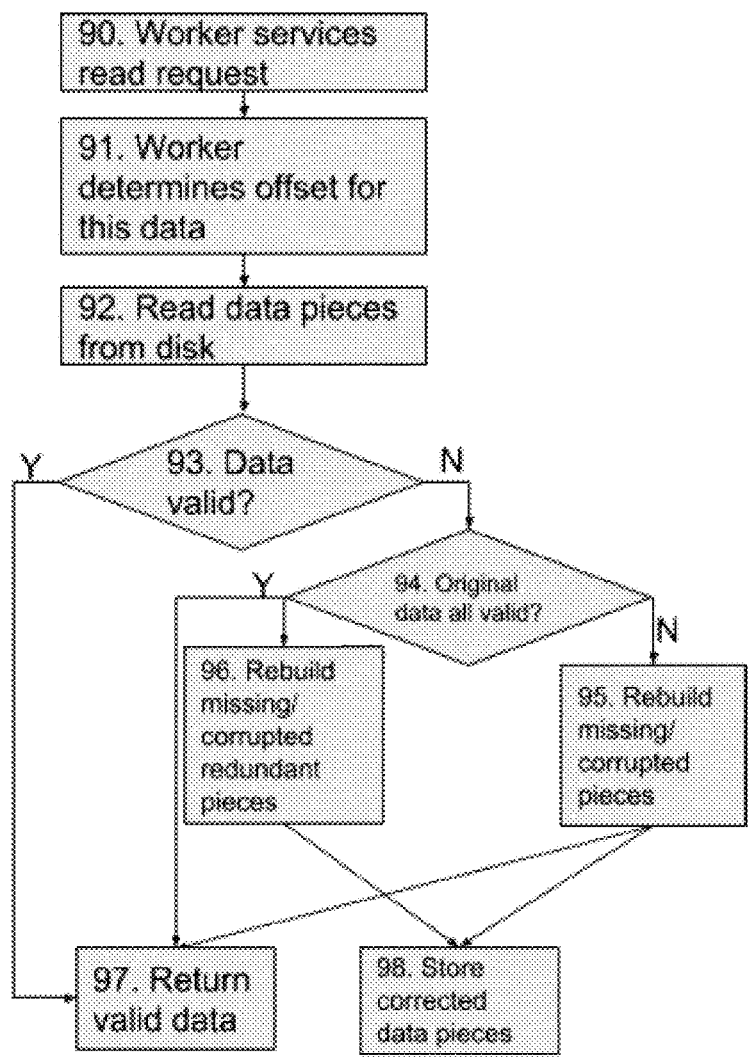
FIG. 10 illustrates a method of reading data using the system of FIG. 9.

Therefore, in a standard read request, a worker thread will note to the system that it will service the read request in step 90 (see FIG. 10). After this, the worker thread will determine the offset associated with the item of data which is the subject of the read request in step 91. Once the offset is determined, the worked thread will read all pieces of data at that offset from each of the plurality of storage media associated with that item of data.

The worker thread will then determine, in step 93, whether the item of data that results from the combination of the pieces of data is valid. If so, 'Y' in FIG. 10, the method proceeds to step 97 and the item of data is returned to the requester. If not, 'N' in FIG. 10, the method proceeds to step 94 where a determination is made as to whether the pieces of data which have been successfully read make up the entirety of the original item of data i.e. whether only redundancy pieces of data have been lost. If so, 'Y' in FIG. 10, the method proceeds to perform, in parallel, steps 96 and 97. In step 96, the missing or corrupted redundancy pieces are rebuilt using methods known per se in the art. After step 96 has been performed, the rebuilt pieces of data are stored in step 98. If not, 'N' in FIG. 10, the method proceeds to step 95, whereupon the missing or corrupted pieces of data are rebuilt using methods known per se in the art. Subsequently, the method proceeds to perform steps 97 and 98 in parallel.

Figure 11:
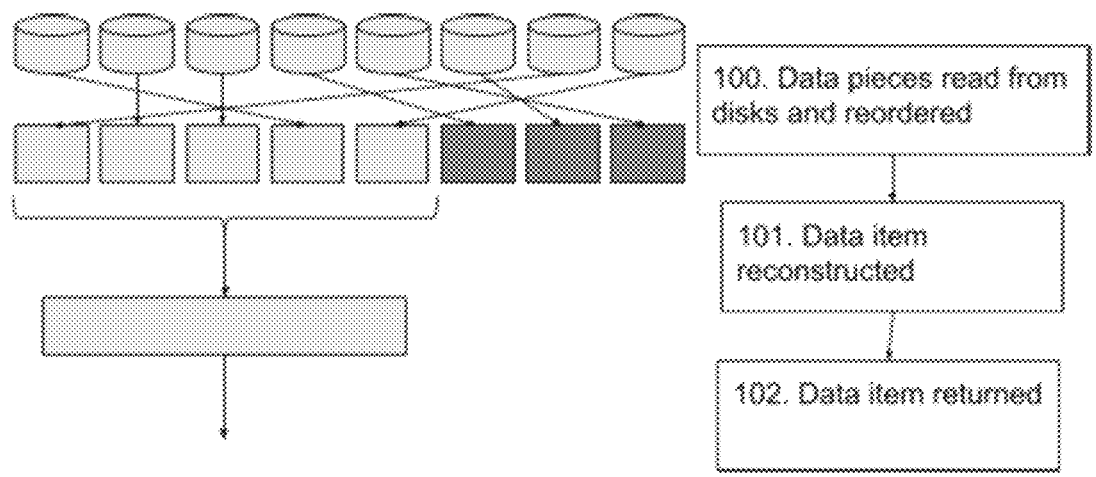
FIG. 11 illustrates a method of reading data according to the present invention.

Method steps 92, 93, and 97 are shown schematically in FIG. 11. Here, in step 100 all data pieces are read from the plurality of storage media and are reordered. The reordering may be such as to have, at the end of the reordered pieces, only the redundancy pieces of data. In step 101, the data item is reconstructed from the read and reordered pieces of data, before the data item is returned in step 102.

Figure 12:
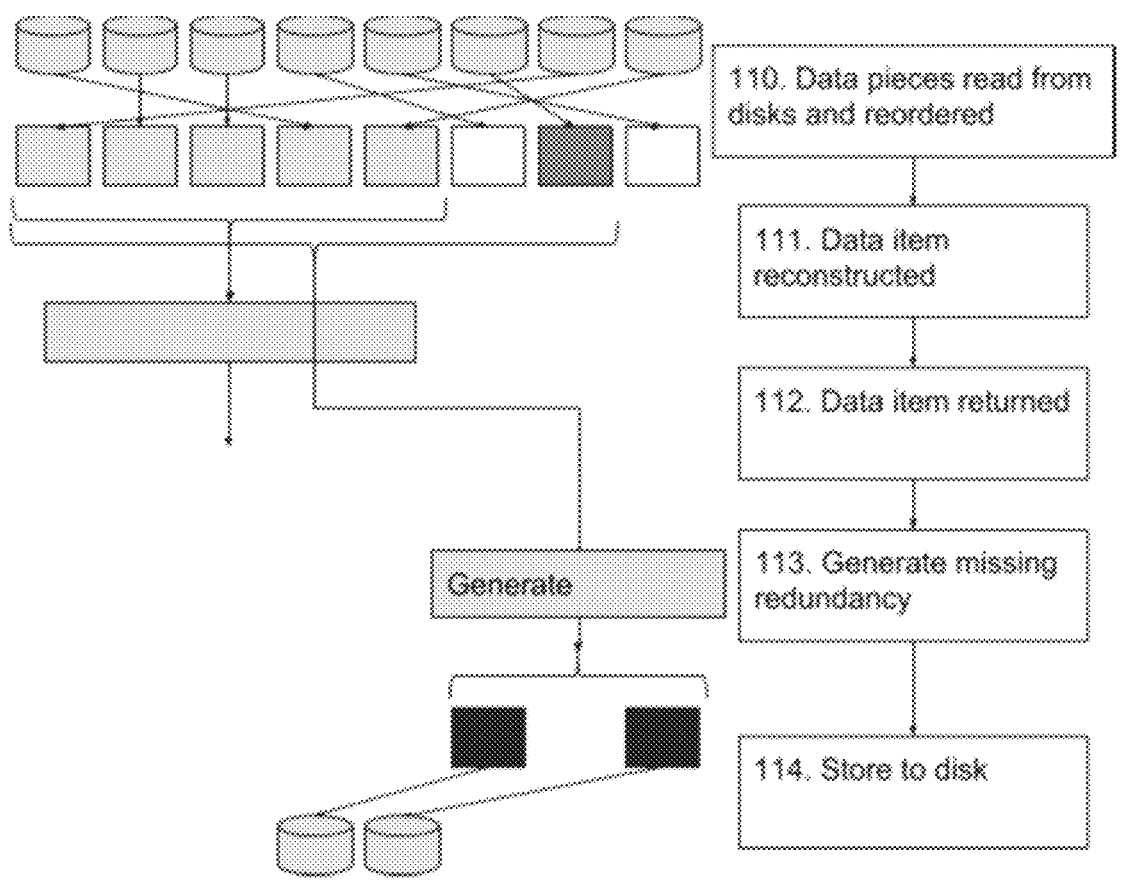
FIG. 12 illustrates a method of reading and rebuilding data according to the present invention.

Method steps 92, 93, 94, 96, and 97 are shown schematically in FIG. 12. Here, in step 110, all uncorrupted and present data pieces are read from the plurality of storage media and are reordered. It is determined that, in this example, two redundancy pieces of data are missing or corrupted. In step 111, the data item is reconstructed and returned to the requested in stem 112. Step 113 is then performed, whereupon the missing redundancy pieces of data are generated before being stored in step 114. Whilst steps 113 and 114 are shown as being performed in series after step 112 in this example, they may be performed in parallel with step 112 after step 111.

Figure 13:
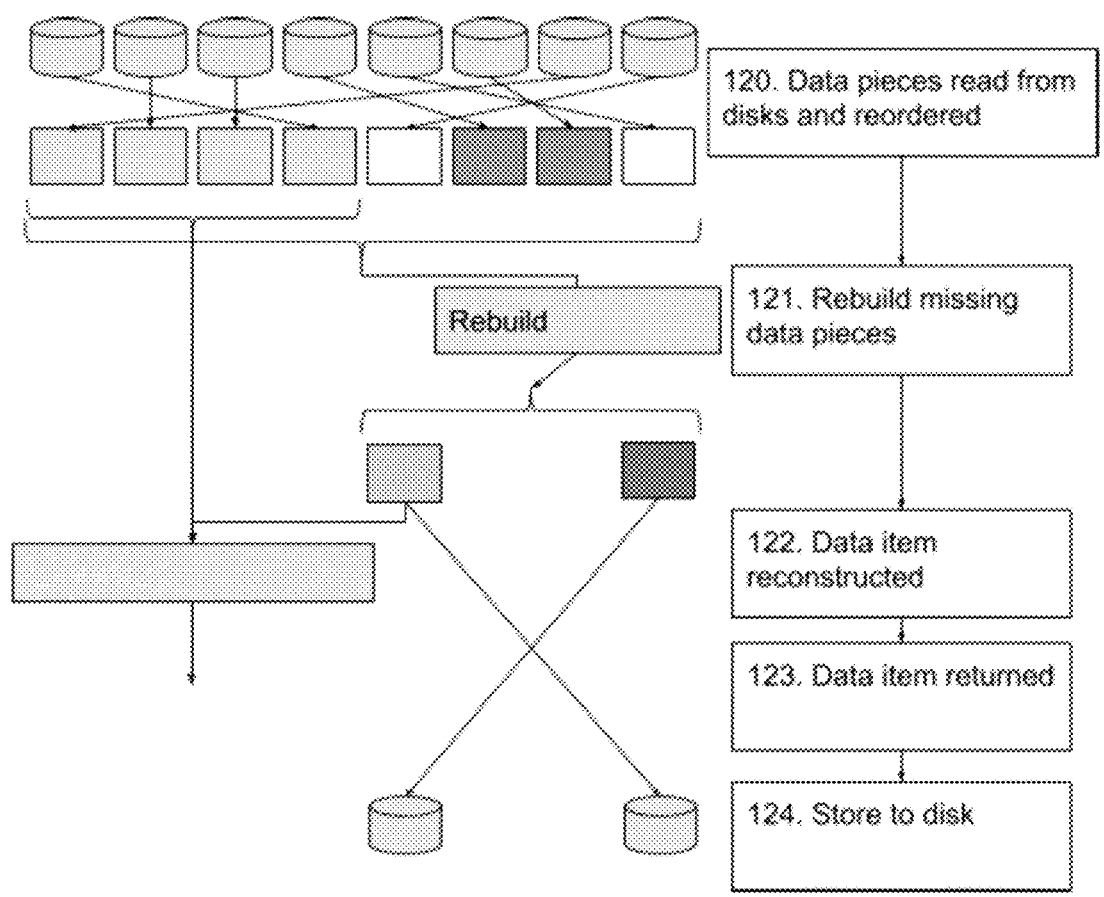
FIG. 13 illustrates a method of reading and rebuilding data according to the present invention.

Method steps 92, 93, 94, 95, 97, and 98 are shown schematically in FIG. 13. Here, in step 120, all uncorrupted and present data pieces are read from the plurality of storage media and are then reordered. It is determined that, in this example, one redundancy piece of data and one piece of data making up the item of data are missing or corrupted. Next, in step 121, all missing or corrupted pieces of data are rebuilt as discussed above. The rebuilt piece of data making up the item of data is then used with the previously read pieces of data to reconstruct the item of data in step 122, which is then returned to the requester of the item of data in step 123. Finally, the rebuilt pieces of data are stored to the storage media in step 124.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A computer-implemented method of storing an item of data across a plurality of storage media, the method comprising:
    receiving an item of data to be stored;
    splitting the item of data into N pieces of data;
    generating M redundancy pieces of data, usable to rebuild the item of data, using the N pieces of data; and
    storing the N pieces of data and the M redundancy pieces of data in the plurality of storage media, wherein each of the N pieces of data and each of the M redundancy pieces of data are stored on a different storage medium of the plurality of storage media relative to other storage mediums of the plurality of storage media, wherein each storage medium of the plurality of storage media stores a file of a file set, wherein data for each file of the file set is stored at a plurality of offsets within each file of the file set, wherein the N pieces of data and the M redundancy pieces of data are stored at a first offset of the plurality of offsets, the first offset corresponding to a same position within each storage medium of the plurality of storage media.

2. The computer-implemented method of claim 1, further including, after receiving the item of data to be stored, of determining a value of M and N based on one or more properties of the item of data and/or one or more properties of the plurality of storage media.

3. The computer-implemented method of claim 1, wherein the value of M is based on a redundancy level.

4. The computer-implemented method of claim 3, wherein the redundancy level is based on a retention schedule associated with the item of data.

5. The computer-implemented method claim 3, further comprising:
    capturing, by a video camera, the item of data; and
    determining whether or not the item of data includes a predetermined feature of interest, wherein the redundancy level is based on the determination of whether or not the item of data includes the predetermined feature of interest.

6. The computer-implemented method of claim 3, further comprising:
    capturing, by a video camera, the item of data; and
    deriving an importance level of the item of data, wherein the redundancy level is based on the derivation of the importance level of the item of data.

7. The computer-implemented method of claim 1, wherein generating the M redundancy pieces of data is performed by passing the N pieces of data to an erasure coding algorithm.

8. The computer-implemented method of claim 1, including removing an expired item of data by hole punching the items of data corresponding to the expired item of data.

9. The computer-implemented method of claim 8, wherein removing the expired item of data includes compressing the hole left by the hole punching in each file of the respective file set.

10. A computer-implemented method of rebuilding lost pieces of an item of data, comprising the steps of:
- reading a plurality of pieces of data associated with the item of data, each piece of data of the plurality of pieces of data being associated with metadata;
- determining, based on the metadata associated with each piece of data of the plurality of pieces of data, a number of lost or corrupted pieces of data of the item of data;
- rebuilding the lost or corrupted pieces of data of the item of data; and
- storing the rebuilt lost or corrupted pieces of data according to the method of claim 1.

11. The computer-implemented method of claim 10, wherein the rebuilding the lost or corrupted pieces of data of the item of data is based on one or more of:
- a determined importance of the item of data;
- a redundancy level of the item of data; and
- a retention policy of the item of data, wherein the retention policy is associated with a requirement time of the item of data.

12. A computer-implemented method of reading an item of data, the method comprising:
- determining an offset at which N pieces of data and M redundancy pieces of data associated with the item of data are stored in each storage medium of a plurality of storage media, wherein each of the N pieces of data and each of the M redundancy pieces of data are stored on a different storage medium of the plurality of storage media relative to other storage mediums of the plurality of storage media, wherein each storage medium of the plurality of storage media stores a file of a file set, wherein data for each file of the file set is stored at a plurality of offsets within each file of the file set, wherein the N pieces of data and the M redundancy pieces of data are stored at a first offset of the plurality of offsets, the first offset corresponding to a same position within each storage medium of the plurality of storage media;
- reading each of the N pieces of data and M redundancy pieces of data, and thereby generating a read item of data, each read piece of data being associated with corresponding metadata;
- determining, based on the metadata associated with each read piece of data, whether the read item of data is valid; and
- returning the read item of data to a requester of the item of data when it is determined that the read item of data is valid.

13. The computer-implemented method of claim 12, further comprising:
- rebuilding any lost or corrupted pieces of the item of data when it is determined that the read item of data is invalid or incomplete.

14. The computer-implemented method of claim 13, wherein the rebuilding of lost or corrupted pieces of data is based on one or more of:
- a determined importance of the item of data;
- a redundancy level of the item of data; and
- a retention policy of the item of data, wherein the retention policy is associated with a requirement time of the item of data.

15. The computer-implemented method of claim 13, wherein rebuilding the lost pieces of data includes determining whether only redundant pieces of data are missing, and wherein the method includes rebuilding the lost redundancy pieces in parallel to returning the read item of data.

16. A system, including a network adapter, a processor, and a plurality of storage media, wherein the processor is configured to:
- receive, via the network adapter, an item of data to be stored;
- split the data into N pieces of data;
- generate M redundancy pieces of data, usable to rebuild the item of data, using the N pieces of data; and
- store the N pieces of data and the M redundancy pieces of data in the plurality of storage media, wherein each of the N pieces of data and each of the M redundancy pieces of data are stored on a different storage medium of the plurality of storage media relative to other storage mediums of the plurality of storage media, wherein each storage medium of the plurality of storage media stores a file of a file set, wherein data for each file of the file set is stored at a plurality of offsets within each file of the file set, wherein the N pieces of data and the M redundancy pieces of data are stored at a first offset of the plurality of offsets, the first offset corresponding to a same position within each storage medium of the plurality of storage media.

17. The system of claim 16, wherein the processor is configured to, after receiving the item of data to be stored, determine a value of M and N based on one or more properties of the item of data and/or one or more properties of the plurality of storage media.

18. The computer-implemented method of claim 6, wherein the derived importance level of the item of data is determined based on a time instance of capturing the item of data by the video camera.

* * * * *